United States Patent
Fang et al.

(10) Patent No.: US 7,301,193 B2
(45) Date of Patent: Nov. 27, 2007

(54) STRUCTURE AND METHOD FOR LOW VSS RESISTANCE AND REDUCED DIBL IN A FLOATING GATE MEMORY CELL

(75) Inventors: Shenqing Fang, Fremont, CA (US); Timothy Thurgate, Sunnyvale, CA (US); Kuo-Tung Chang, Saratoga, CA (US); Richard Fastow, Cupertino, CA (US); Angela T. Hui, Fremont, CA (US); Kazuhiro Mizutani, Sunnyvale, CA (US); Kelwin Ko, San Jose, CA (US); Hiroyuki Kinoshita, Sunnyvale, CA (US); Yu Sun, Saratoga, CA (US); Hiroyuki Ogawa, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 632 days.

(21) Appl. No.: 10/762,445

(22) Filed: Jan. 22, 2004

(65) Prior Publication Data
US 2005/0164450 A1    Jul. 28, 2005

(51) Int. Cl.
H01L 29/788    (2006.01)
(52) U.S. Cl. .................. 257/315; 257/E29.3
(58) Field of Classification Search ........ 257/314–317, 257/321; 438/201, 211, 262
See application file for complete search history.

(56) References Cited

U.S. PATENT DOCUMENTS

| | | | |
|---|---|---|---|
| 5,607,881 A | 3/1997 | Huang | |
| 5,640,035 A | 6/1997 | Sudo et al. | |
| 6,147,379 A * | 11/2000 | Hori et al. | ............ 257/317 |
| 6,180,441 B1 | 1/2001 | Yue et al. | |
| 6,531,347 B1 | 3/2003 | Huster et al. | |
| 6,721,205 B2 * | 4/2004 | Kobayashi et al. | .... 365/185.26 |
| 2001/0031534 A1 | 10/2001 | Ahn et al. | |
| 2003/0006462 A1 | 1/2003 | Quek et al. | |

FOREIGN PATENT DOCUMENTS

EP    0401 174    12/1990

* cited by examiner

*Primary Examiner*—Asok Kumar Sarkar
(74) *Attorney, Agent, or Firm*—Farjami & Farjami LLP

(57) ABSTRACT

According to one exemplary embodiment, a floating gate memory cell comprises a stacked gate structure situated on a substrate and situated over a channel region in the substrate. The floating gate memory cell further comprises a recess formed in the substrate adjacent to the stacked gate structure, where the recess has a sidewall, a bottom, and a depth. According to this exemplary embodiment, the floating gate memory cell further comprises a source situated adjacent to the sidewall of the recess and under the stacked gate structure. The floating gate memory cell further comprises a Vss connection region situated under the bottom of the recess and under the source, where the Vss connection region is connected to the source. The Vss connection region being situated under the bottom of the recess causes the source to have a reduced lateral diffusion in the channel region.

12 Claims, 9 Drawing Sheets

STRUCTURE AND METHOD FOR LOW VSS RESISTANCE AND REDUCED DIBL IN A FLOATING GATE MEMORY CELL

TECHNICAL FIELD

The present invention is generally in the field of semiconductor fabrication. More particularly, the present invention is in the field of floating gate memory device fabrication.

BACKGROUND ART

High performance flash memory devices, such as NOR-type flash memory devices, require high density and high operating speed as the device dimensions are scaled down. A low resistance Vss line, which connects source regions of flash memory cells situated between two word lines, is used to reduce memory core cell size, improve circuit density, and increase flash memory device performance.

In a conventional flash memory process flow, the Vss line can be formed by heavily doping the semiconductor substrate by using a Vss connection implant. In order to achieve a desirably low Vss resistance, a sufficient amount and a sufficient depth of doping are required along the Vss line in the semiconductor substrate. However, by introducing the amount and depth of doping required to sufficiently lower Vss resistance, a short channel effect known as drain induced barrier lowering (DIBL) can undesirably increase in a flash memory cell, such as a floating gate flash memory cell. By way of background, DIBL occurs when a voltage applied to the drain of the memory cell, such as a floating gate flash memory cell, causes the drain's electric field to directly affect the controllability of memory cell's channel. As a result of DIBL, the memory cell's threshold voltage decreases and leakage current increases, which detrimentally affect memory cell performance.

Thus, there is a need in the art for a floating gate flash memory cell, such as a NOR-type floating gate flash memory cell, having reduced DIBL and a sufficiently low Vss resistance.

SUMMARY

The present invention is directed to structure and method for low Vss resistance and reduced DIBL in a floating gate memory cell. The present invention addresses and resolves the need in the art for a floating gate flash memory cell, such as a NOR-type floating gate flash memory cell, having reduced DIBL and sufficiently low Vss resistance.

According to one exemplary embodiment, a floating gate memory cell is situated on a substrate, the floating gate memory cell comprising a stacked gate structure situated on the substrate, where the stacked gate structure is situated over a channel region in said substrate. The stacked gate structure can comprise an ONO stack situated on a floating gate. The floating gate memory cell can be, for example, a NOR-type floating gate flash memory cell. The floating gate memory cell further comprises a recess formed in the substrate adjacent to the stacked gate structure, where the recess has a sidewall, a bottom, and a depth. The sidewall of the recess can be substantially perpendicular to a top surface of the substrate. The depth of the recess can be between approximately 200.0 Angstroms and approximately 500.0 Angstroms, for example.

According to this exemplary embodiment, the floating gate memory cell further comprises a source situated adjacent to the sidewall of the recess and under the stacked gate structure. The floating gate memory cell further comprises a Vss connection region situated under the bottom of the recess and under the source, where the Vss connection region is connected to the source. The Vss connection region situated under the bottom of the recess causes the source to have a reduced lateral diffusion in the channel region. The reduced lateral diffusion of the source in the channel region causes a reduction in drain induced barrier lowering (DIBL) in the floating gate memory cell. The recess allows a resistance of the Vss connection region to be decreased without increasing DIBL in the floating gate memory cell. In one embodiment, the invention is a method for fabricating the above discussed floating gate memory cell. Other features and advantages of the present invention will become more readily apparent to those of ordinary skill in the art after reviewing the following detailed description and accompanying drawings.

DETAILED DESCRIPTION OF THE INVENTION

The present invention is directed to structure and method for low Vss resistance and reduced DIBL in a floating gate memory cell. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
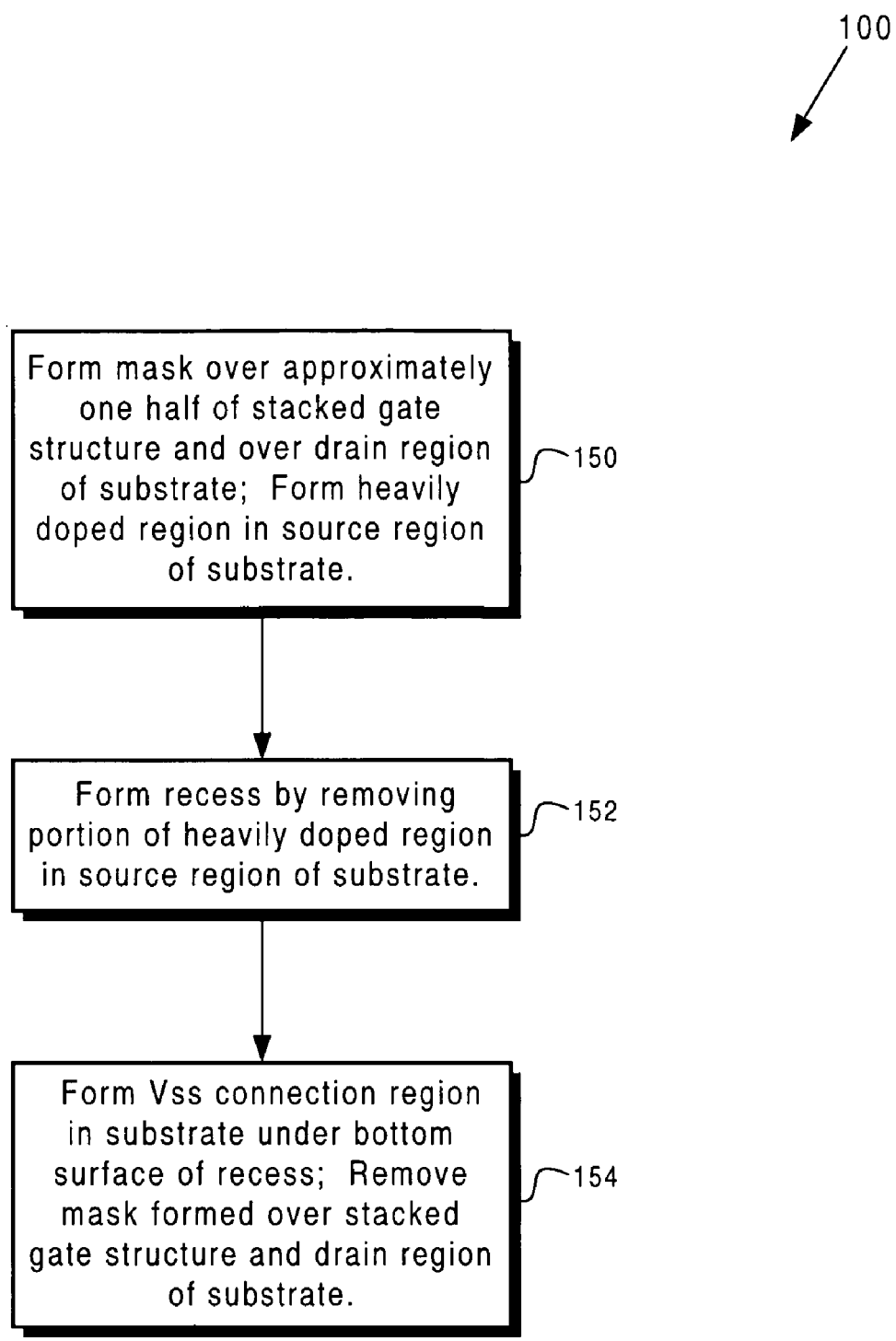
FIG. 1 is a flowchart corresponding to exemplary method steps according to one embodiment of the present invention.

FIG. 1 shows a flowchart illustrating an exemplary method for forming a floating gate flash memory cell including a recessed Vss implant region and a source having reduced source diffusion according to one embodiment of the present invention. Certain details and features have been left out of flowchart 100 that are apparent to a person of ordinary skill in the art. For example, a step may consist of one or more substeps or may involve specialized equipment or materials, as known in the art. Steps 150, 152, and 154 indicated in flowchart 100 are sufficient to describe one embodiment of the present invention, other embodiments of the invention may utilize steps different from those shown in flowchart 100. It is noted that the processing steps shown in flowchart 100 are performed on a wafer, which, prior to step 150, includes a stacked gate structure of a floating gate memory cell situated on a substrate which includes source and drain regions situated adjacent to the stacked gate structure. The stacked gate further includes a tunnel oxide layer situated on the substrate, a floating gate situated on the tunnel oxide layer, an Oxide-Nitride-Oxide (ONO) stack situated on the floating gate, and a control gate situated on the ONO stack. Structures 250, 252, and 254 in FIGS. 2A, 2B, and 2C illustrate the result of performing, on a structure including a stacked gate structure situated on a substrate discussed above, steps 150, 152, and 154 of flowchart 100, respectively.

Figure 2A:
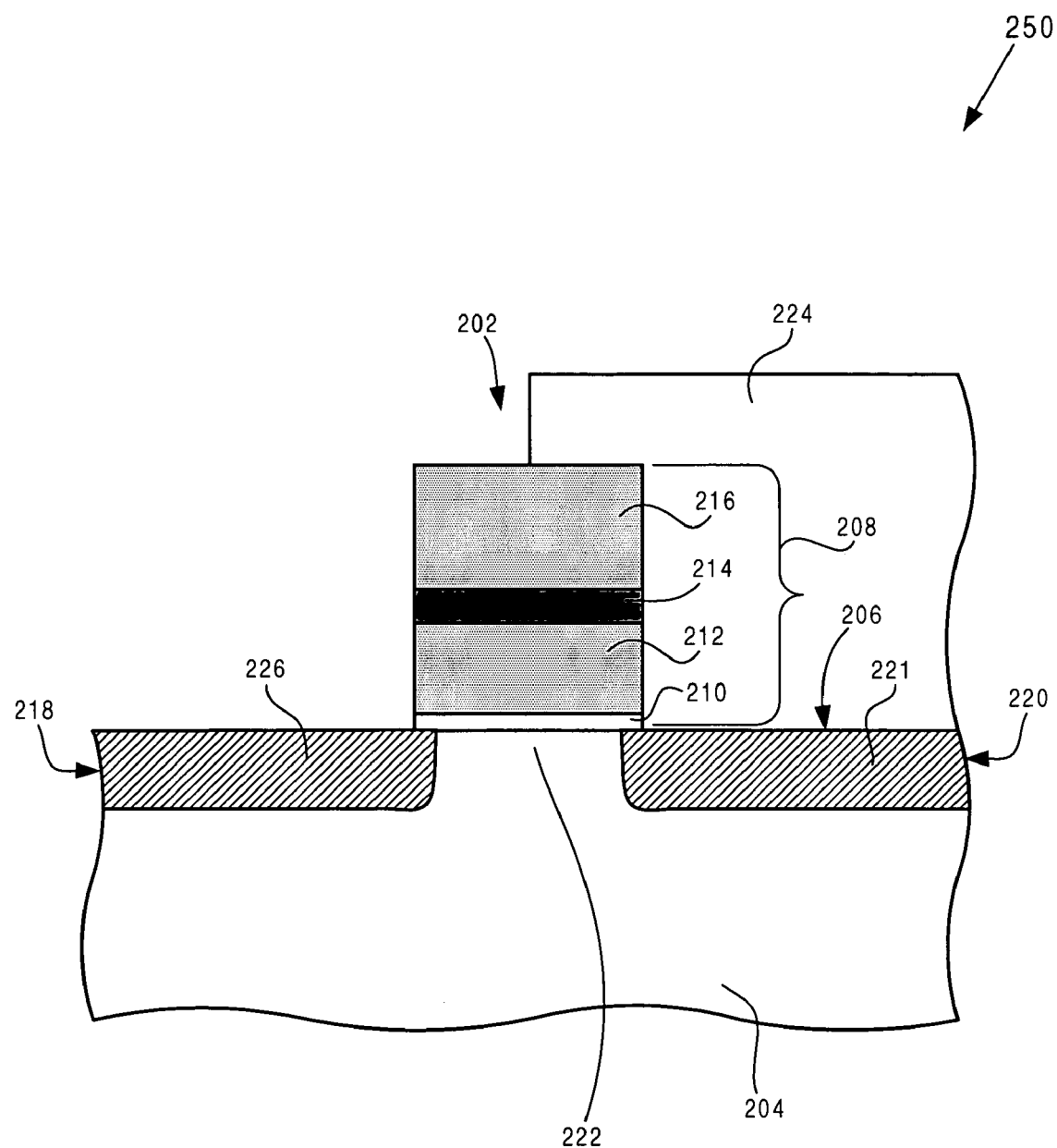
FIG. 2A illustrates a cross-sectional view of a portion of a wafer processed according to an embodiment of the invention, corresponding to certain steps of the flowchart in FIG. 1.
Figure 2B:
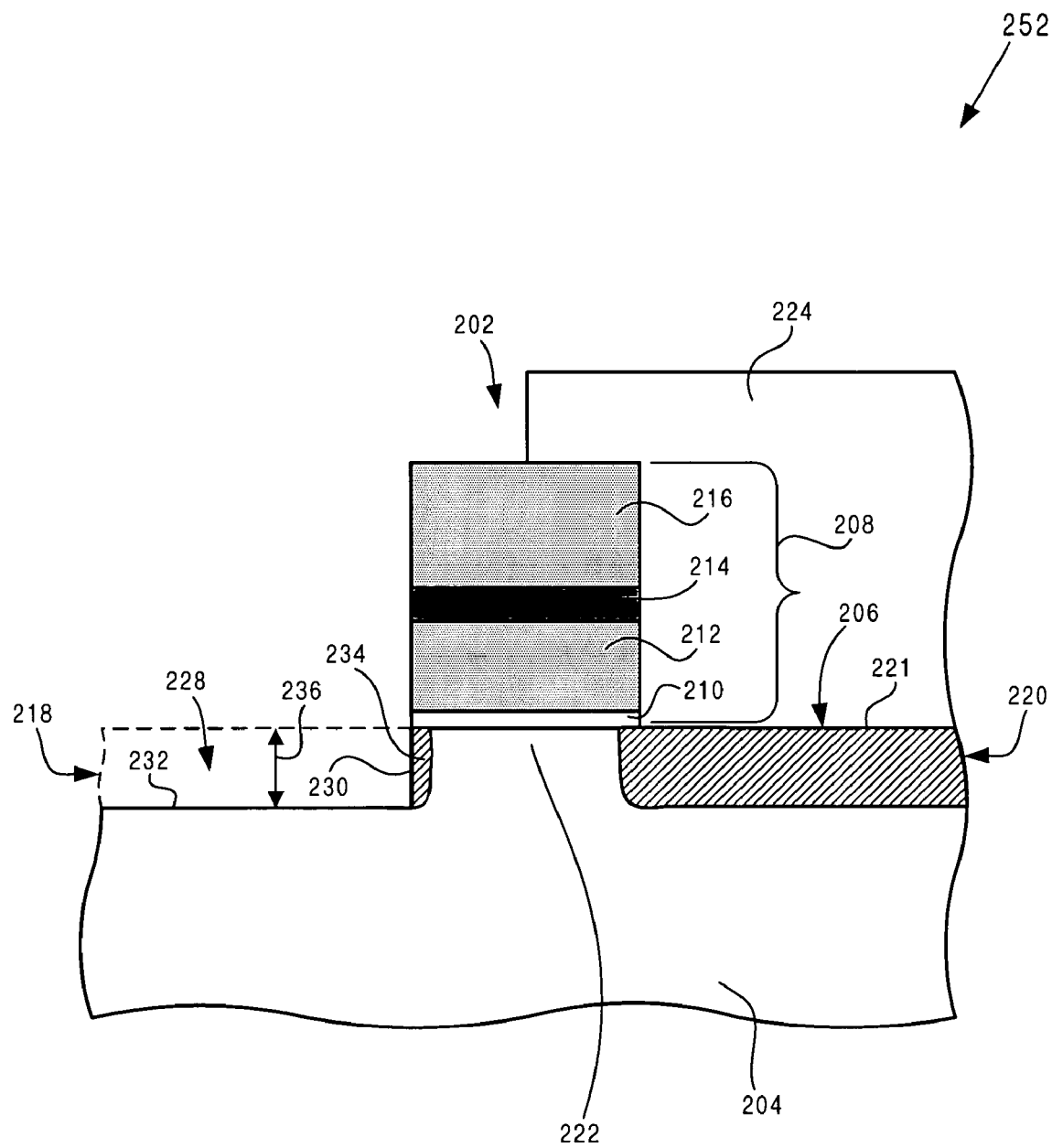
FIG. 2B illustrates a cross-sectional view of a portion of a wafer processed according to an embodiment of the invention, corresponding to certain steps of the flowchart in FIG. 1.
Figure 2C:
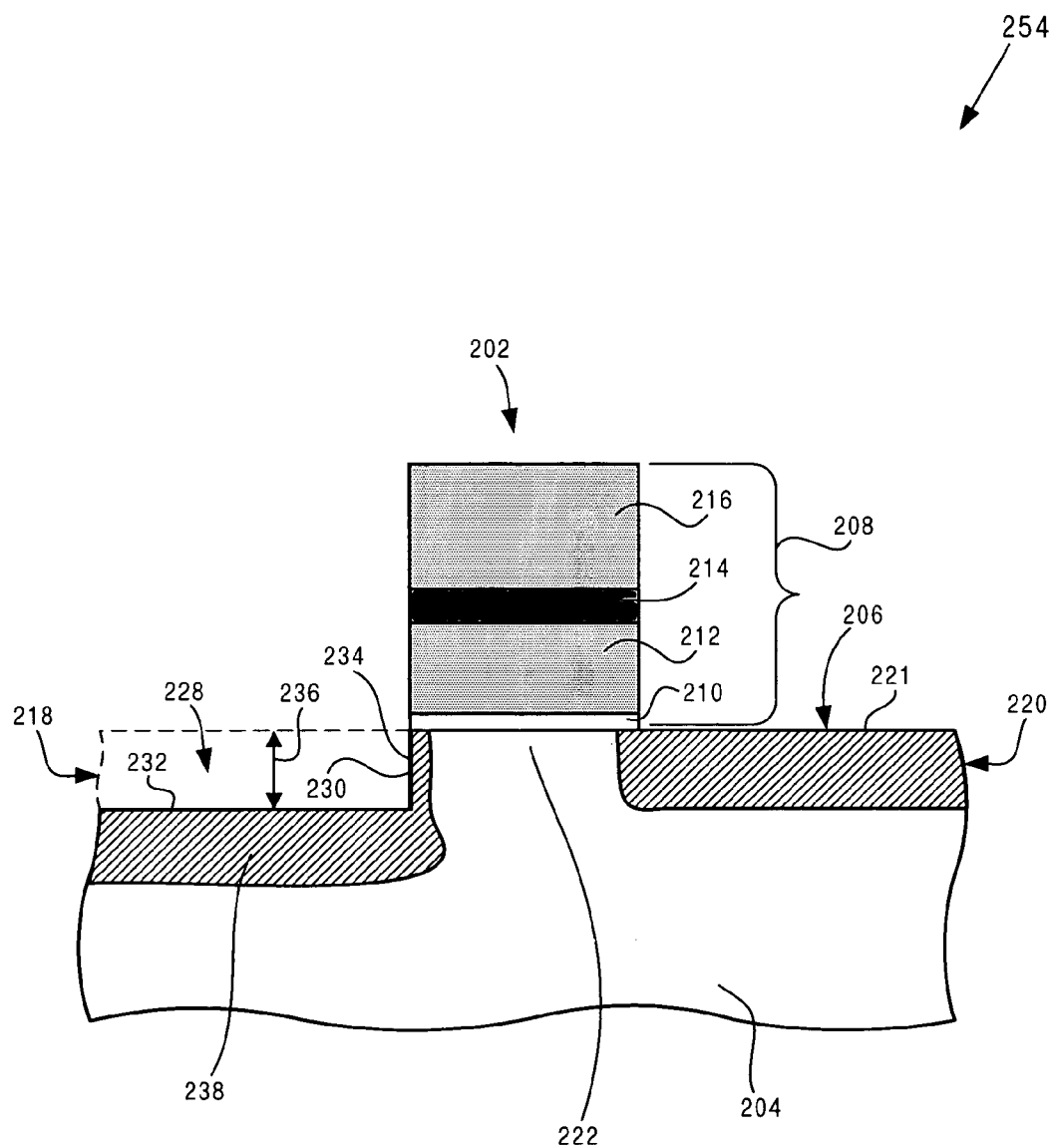
FIG. 2C illustrates a cross-sectional view of a portion of a wafer processed according to an embodiment of the invention, corresponding to certain steps of the flowchart in FIG. 1.

Referring now to step 150 in FIG. 1 and structure 250 in FIG. 2A, at step 150 of flowchart 100, mask 224 is formed over approximately one half of stacked gate structure 208 and over drain region 220 of substrate 204 and heavily doped region 226 is formed in source region 218 of substrate 204. As shown in FIG. 2A, mask 224 is situated over the approximate one half of stacked gate structure 208 situated adjacent to drain region 220 and over drain region 220 of substrate 204. Mask 224 can be a self-aligned source (SAS) mask, which can be formed in a manner known in the art, and can comprise an appropriate masking material, such as photoresist. Structure 250 can comprise a flash memory device, such as a NOR-type flash memory device. By way of background, a NOR-type flash memory device is a flash memory device configured in a NOR architecture, where source regions are typically connected by Vss lines running parallel to word lines. Floating gate memory cell 202 can be a floating gate flash memory cell, such as a NOR-type floating gate flash memory cell.

Also shown in FIG. 2A, heavily doped region 226 is situated in source region 218 of substrate 204 and can be formed by utilizing a source implant to appropriately implant a desired amount of an appropriate N type dopant in source region 218. The source implant can be performed in a manner known in the art. Further shown in FIG. 2A, stacked gate structure 208 is situated on substrate 204 and includes tunnel oxide layer 210, floating gate 212, ONO stack 214, and control gate 216. Also shown in FIG. 2A, tunnel oxide layer 210 is situated over channel region 222 on top surface 206 of substrate 204 and can comprise thermally grown tunnel oxide. Further shown in FIG. 2A, floating gate 212 is situated on tunnel oxide layer 210 and can comprise polycrystalline silicon (also referred to as polysilicon), which can be deposited in a low pressure chemical vapor deposition (LPCVD) process or other appropriate processes.

Also shown in FIG. 2A, ONO stack 214 is situated on floating gate 212. ONO stack 214 is a three-layer structure, which comprise a bottom layer of silicon oxide, a middle layer of silicon nitride, and a top layer of silicon oxide, which can be sequentially deposited by LPVCD process or thermally grown. Further shown in FIG. 2A, control gate 216 is situated on ONO stack 214 and can comprise polysilicon, which can be formed on ONO stack 214 by utilizing an LPCVD process or other appropriate processes. Also shown in FIG. 2A, source region 218 and drain region 220 are situated in substrate 204 and can be formed in a manner known in the art. Further shown in FIG. 2A, drain 221 is situated in drain region 220 and can comprise, for example, an appropriate N type dopant. Referring to FIG. 2A, the result of step 150 of flowchart 100 is illustrated by structure 250.

Continuing with step 152 in FIG. 1 and structure 252 in FIG. 2B, at step 152 of flowchart 100, recess 228 is formed in source region 218 of substrate 204 by removing a portion of heavily doped region 226. Recess 228 has sidewall 230, bottom 232, and depth 236, which indicates the distance between bottom 232 of recess 228 and top surface 206 of substrate 204. By way of example, depth 236 can be between approximately 200.0 Angstroms and approximately 500.0 Angstroms. Recess 228 can be formed by etching away a substantial portion of heavily doped region 226 in substrate 204 by utilizing a SAS etch process. In the present embodiment, sidewall 230 of recess 228 can be substantially perpendicular to top surface 206 of substrate 204. In another embodiment, sidewall 230 of recess 228 may form an angle other than approximately 90.0° with respect to top surface 206 of substrate 204. During the SAS etch process, oxide is also removed from shallow trench isolation (STI) regions (not shown in any of the figures) to expose trenches in preparation for a subsequent Vss connection implant.

Also shown in FIG. 2B, after a substantial portion of heavily doped region 226 in FIG. 2A has been removed, a remaining portion of doped region 226 forms source 234 of floating gate memory cell 202. As shown in FIG. 2B, source 234 is situated adjacent to sidewall 230 of recess 228 and also situated under stacked gate structure 208. Referring to FIG. 2B, the result of step 152 of flowchart 100 is illustrated by structure 252.

Referring now to step 154 in FIG. 1 and structure 254 in FIG. 2C, at step 154 of flowchart 100, Vss connection region 238 is formed in substrate 204 under bottom 232 of recess 228 and mask 224 is removed. Vss connection region 238 can be formed by utilizing a Vss connection implant as known in the art to implant a heavy concentration of dopant under bottom 232 of recess 228. As shown in FIG. 2C, Vss connection region 238 is situated under bottom 232 of recess 228 and is also situated under and connected to source 234 of floating gate memory cell 202. Vss connection region 238 can be, for example, heavily doped with an appropriate N type dopant. Vss connection region 238 forms a common source line, which is utilized to connect source regions of other floating gate memory cells (not shown in any of the figures). Vss connection region 238 has a resistance, which is also referred to as a "Vss resistance" in the present application. Also at step 154, mask 224 in FIG. 2B is removed in a manner known in the art. It is noted that the same mask, i.e. mask 224, is utilized in the above process steps of the embodiment of the present invention in FIG. 1.

In the embodiment of the present invention in FIG. 1, recess 228 is utilized to situate Vss connection region 238 below top surface 206 of substrate 204 by a distance equal to depth 236 of recess 228 and also to situate Vss connection region 238 below source 234. As a result, the present invention achieves a reduction in lateral diffusion of source 234 into channel region 222. Furthermore, the amount of reduction in lateral diffusion of source 234 into channel region 222 can be determined by appropriately selecting depth 236 of recess 228. By reducing lateral diffusion of source 234 into channel region 222, the embodiment of the present invention in FIG. 1 advantageously achieves a reduction in DIBL in floating gate memory cell 202.

Additionally, in the embodiment of the present invention in FIG. 1, by forming recess 228 to appropriately situate Vss connection region 238 below top surface 206 of substrate 204 and to situate Vss connection region 238 below source 234, the resistance of Vss connection region 238, i.e. Vss resistance, can be decreased by heavily doping Vss connection region 238 without causing an undesirably increase in DIBL. In contrast, in a conventional floating gate memory cell, such as a conventional NOR-type floating gate flash memory cell, a recess is not formed to situate the Vss connection region a determined depth below the top surface of the substrate and below the source. As a result, in the conventional floating gate memory cell, a sufficiently low decrease in Vss resistance cannot be achieved without a concomitant increase in DIBL.

Figure 3:
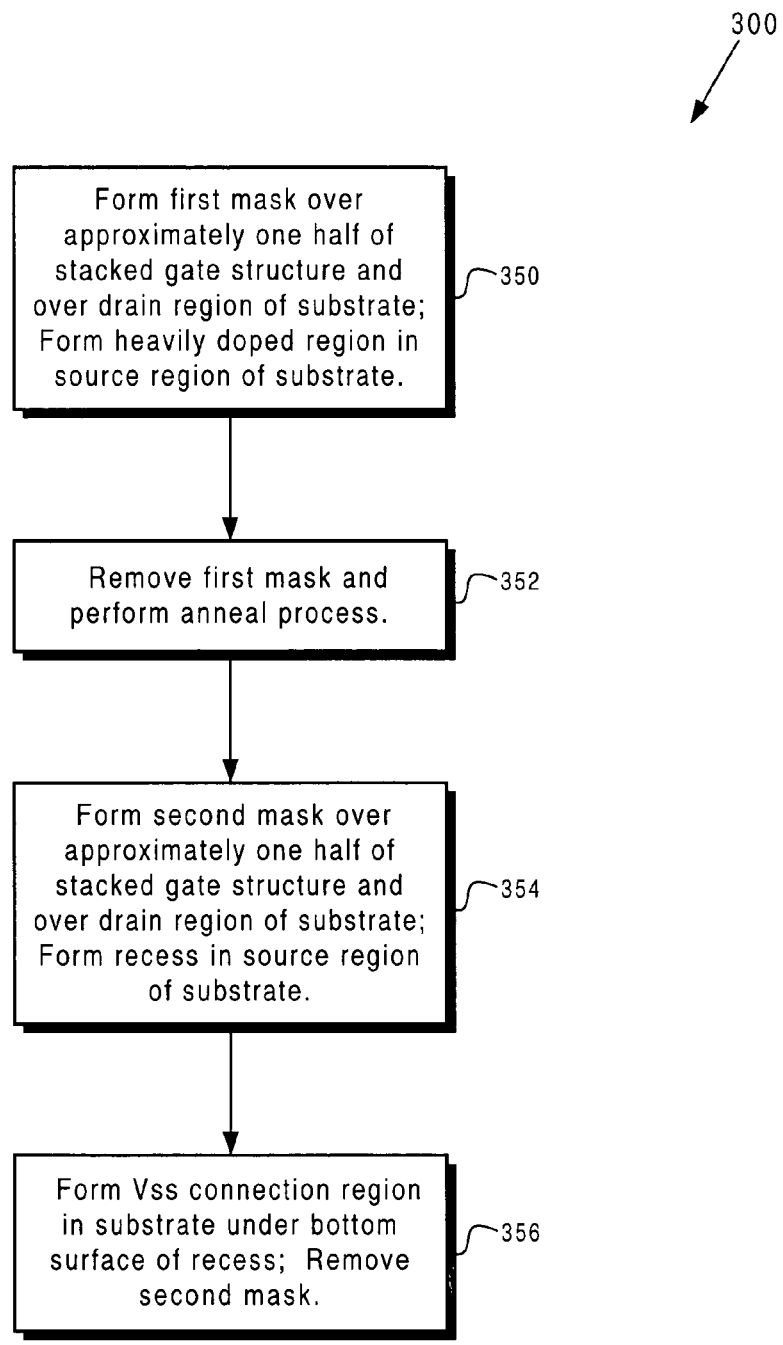
FIG. 3 is a flowchart corresponding to exemplary method steps according to one embodiment of the present invention.

FIG. 3 shows a flowchart illustrating an exemplary method for forming a floating gate flash memory cell including a recessed Vss implant region and a source having reduced source diffusion according to one embodiment of the present invention. Certain details and features have been left out of flowchart 100 that are apparent to a person of ordinary skill in the art. For example, a step may consist of one or more substeps or may involve specialized equipment or materials, as known in the art. Steps 150, 152, and 154 indicated in flowchart 300 are sufficient to describe one embodiment of the present invention, other embodiments of the invention may utilize steps different from those shown in flowchart 300. It is noted that the processing steps shown in flowchart 300 are performed on a wafer, which, prior to step 350, includes a stacked gate structure of a floating gate memory cell situated on a substrate which includes source and drain regions situated adjacent to the stacked gate structure. The stacked gate further includes a tunnel oxide layer situated on the substrate, a floating gate situated on the tunnel oxide layer, an ONO stack situated on the floating gate, and a control gate situated on the ONO stack. Structures 450, 452, 454, and 456 in FIGS. 4A, 4B, 4C, and 4D illustrate the result of performing, on a structure including a stacked gate structure situated on a substrate discussed above, steps 350, 352, 354, and 356 of flowchart 300, respectively.

Figure 4A:
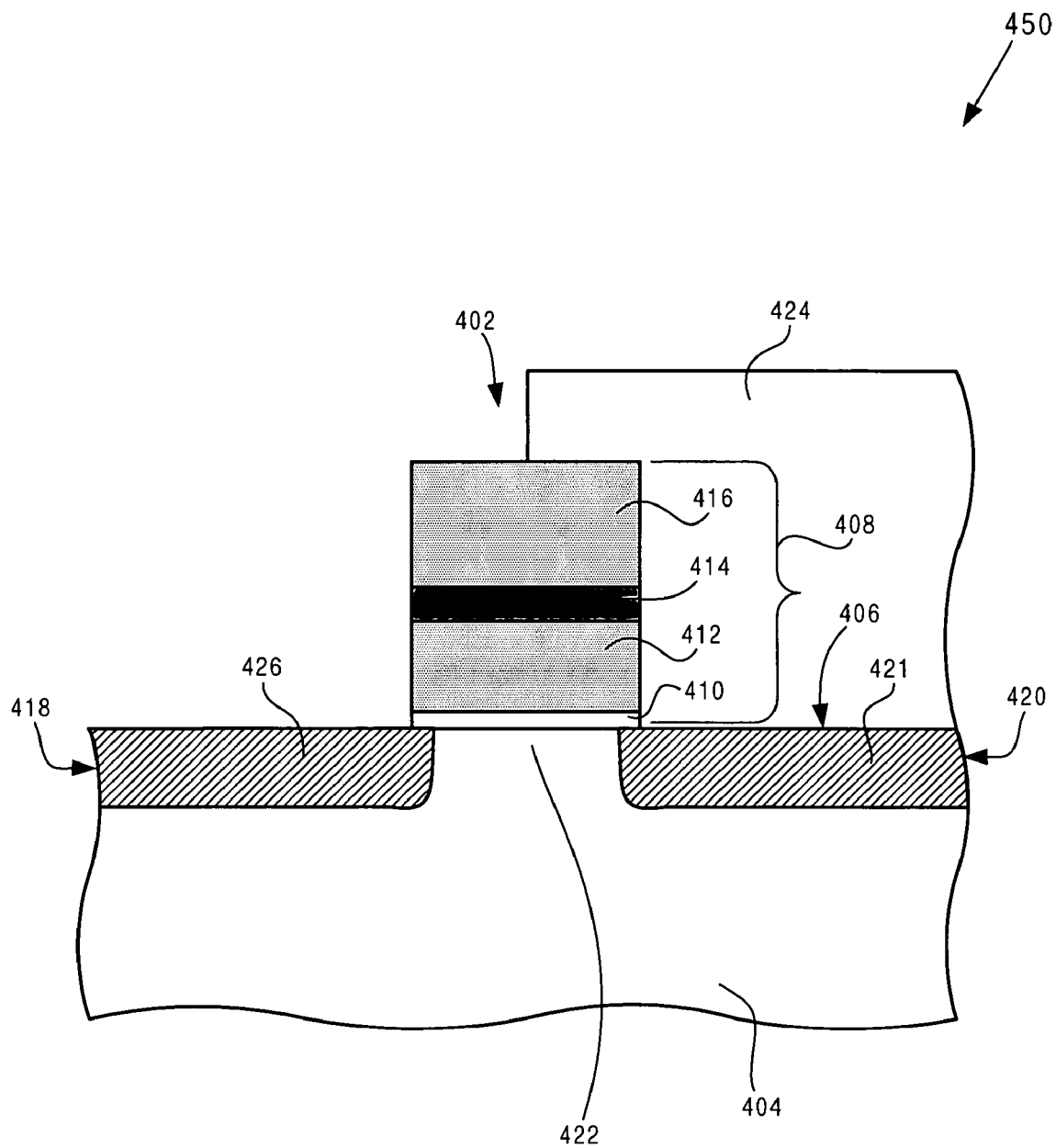
FIG. 4A illustrates a cross-sectional view of a portion of a wafer processed according to an embodiment of the invention, corresponding to certain steps of the flowchart in FIG. 3.

Referring now to step 350 in FIG. 3 and structure 450 in FIG. 4A, at step 350 of flowchart 300, mask 424 is formed over approximately one half of stacked gate structure 408 and over drain region 420 of substrate 404 and heavily doped region 426 is formed in source region 418 of substrate 404. In FIG. 4A, floating gate memory cell 402, substrate 404, top surface 406, stacked gate structure 408, tunnel oxide layer 410, floating gate 412, ONO stack 414, control gate 416, source region 418, drain region 420, drain 421, channel region 422, and mask 424 in structure 450 correspond, respectively, to floating gate memory cell 202, substrate 204, top surface 206, stacked gate structure 208, tunnel oxide layer 210, floating gate 212, ONO stack 214, control gate 216, source region 218, drain region 220, drain 221, channel region 222, and mask 224 in structure 250 in FIG. 2A.

As shown in FIG. 4A, mask 424 is situated over the approximate one half of stacked gate structure 408 situated adjacent to drain region 420 and over drain region 420 of substrate 404. Mask 424 is substantially similar in composition and formation to mask 224 in FIG. 2A. Similar to structure 250 in FIG. 2A, structure 450 can comprise a flash memory device, such as a NOR-type flash memory device. Also shown in FIG. 4A, heavily doped region 426 is situated in source region 418 of substrate 404 and can be formed by utilizing a source implant to appropriately implant a desired amount of an appropriate N type dopant in source region 418. Also shown in FIG. 4A, stacked gate structure 408 is situated on substrate 404 and includes tunnel oxide layer 410, floating gate 412, ONO stack 414, and control gate 416. Further shown in FIG. 4A, tunnel oxide layer 410 is situated over channel region 422 on top surface 406 of substrate 404, floating gate 412 is situated on tunnel oxide layer 410, ONO stack 414 is situated on floating gate 412, and control gate 216 is situated on ONO stack 414. Also shown in FIG. 4A, source region 418 and drain region 420 are situated in substrate 404 and drain 421 is situated in drain region 420. Referring to FIG. 4A, the result of step 350 of flowchart 300 is illustrated by structure 450.

Figure 4B:
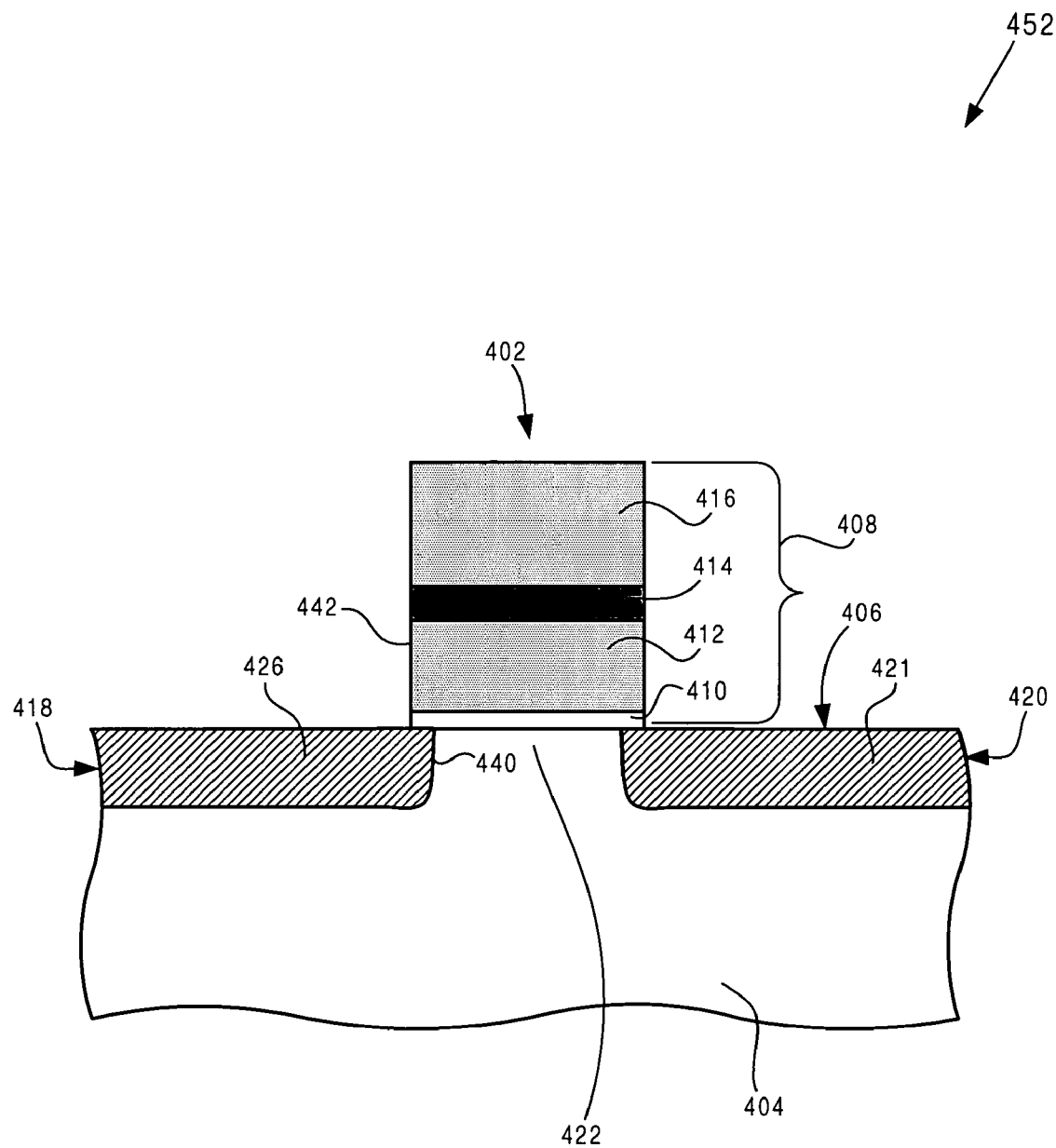
FIG. 4B illustrates a cross-sectional view of a portion of a wafer processed according to an embodiment of the invention, corresponding to certain steps of the flowchart in FIG. 3.

Continuing with step 352 in FIG. 3 and structure 452 in FIG. 4B, at step 352 of flowchart 300, mask 424 is removed and an anneal process is performed. Mask 424 in FIG. 4A can be removed by utilizing an appropriate etch process as known in the art. During the anneal process, substrate 404 is heated to a sufficient temperature such that damage caused by the source implant utilized to form heavily doped region 426 is repaired. The anneal process is also utilized to ensure that diffusion edge 440 of heavily doped region 426 extends under tunnel oxide layer 410 an appropriate distance, as measured in a direction parallel to top surface 406 of substrate 404, beyond sidewall 442 of stacked gate structure 408. For example, the temperature and duration of the anneal process can be controlled to enable diffusion edge 440 of heavily doped region 426 to extend under tunnel oxide an appropriate distance beyond sidewall 442 of stacked gate structure 408. Referring to FIG. 4B, the result of step 352 of flowchart 300 is illustrated by structure 452.

Figure 4C:
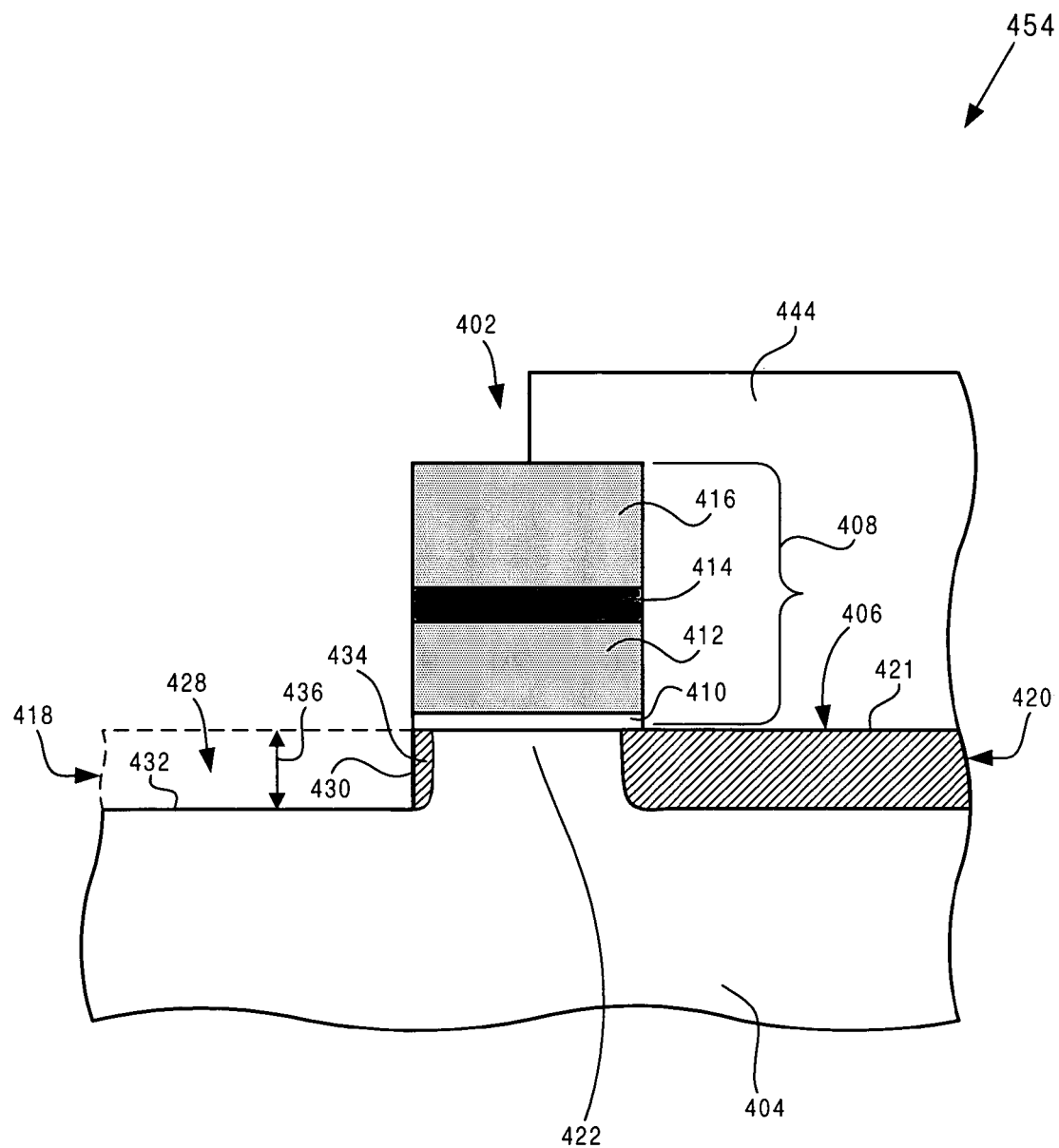
FIG. 4C illustrates a cross-sectional view of a portion of a wafer processed according to an embodiment of the invention, corresponding to certain steps of the flowchart in FIG. 3.

Continuing with step 354 in FIG. 3 and structure 454 in FIG. 4C, at step 354 of flowchart 300, mask 444 is formed over the approximate one half of stacked gate structure 408 situated adjacent to drain region 420 and over drain region 420 of substrate 404 and recess 428 is formed in source region 418 of substrate 404. As shown in FIG. 4C, mask 444 is situated over an approximate one half of stacked gate structure 408 and situated over drain region 420. Mask 444 is substantially similar in composition and formation to mask 424. Also shown in FIG. 4C, recess 428 has sidewall 430, bottom 232, and depth 436, which indicates the distance between bottom 432 of recess 428 and top surface 406 of substrate 404. Recess 428 is substantially similar in depth and formation to recess 228 in FIG. 2B. In the present embodiment, sidewall 430 of recess 428 can be substantially perpendicular to top surface 406 of substrate 404. In another embodiment, sidewall 430 of recess 428 may form an angle other than approximately 90.0° with respect to top surface 406 of substrate 404.

Also shown in FIG. 4C, after a substantial portion of heavily doped region 426 in FIG. 4A has been removed, a remaining portion of doped region 426 forms source 434 of floating gate memory cell 402. As shown in FIG. 4C, source 434 is situated adjacent to sidewall 430 of recess 428 and also situated under stacked gate structure 408. By performing an anneal process at step 352 of flowchart 300 after formation of heavily doped region 426 at step 350, the embodiment of the present invention in FIG. 1 ensures that source 434 has a sufficient width. Referring to FIG. 4C, the result of step 354 of flowchart 300 is illustrated by structure 454.

Figure 4D:
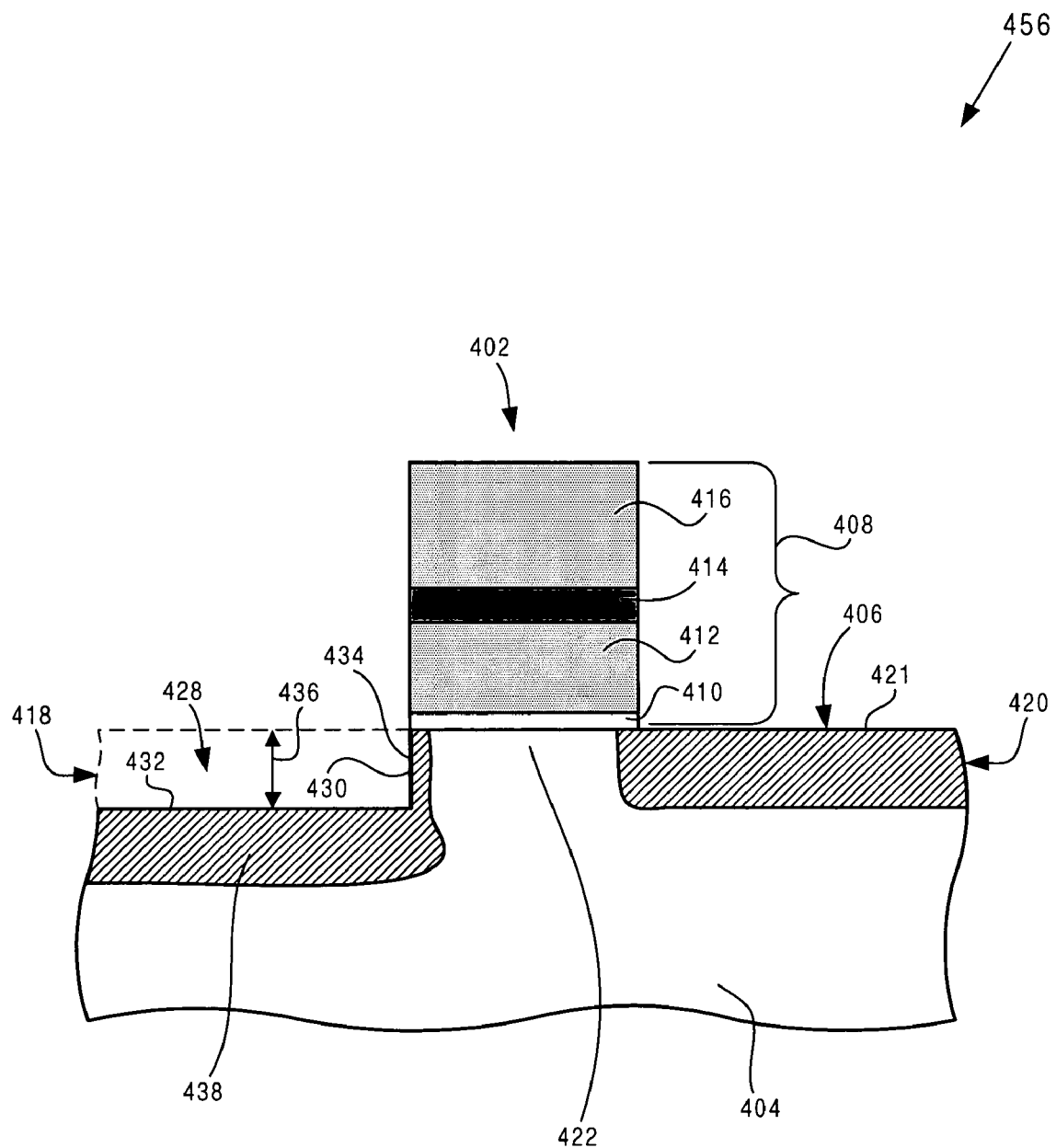
FIG. 4D illustrates a cross-sectional view of a portion of a wafer processed according to an embodiment of the invention, corresponding to certain steps of the flowchart in FIG. 3.

Referring now to step 356 in FIG. 3 and structure 456 in FIG. 2D, at step 356 of flowchart 100, Vss connection region 438 is formed in substrate 404 under bottom 432 of recess 428 and mask 444 is removed. As shown in FIG. 4D, Vss connection region 438 is situated under bottom 432 of recess 428 and is also situated under and connected to source 434 of floating gate memory cell 402. Vss connection region 438 is substantially similar in composition and formation to Vss connection region 238 in FIG. 2C. Similar to Vss connection region 238 in FIG. 2C, Vss connection region 438 forms a common source line, which is utilized to connect source regions of other floating gate memory cells (not shown in any of the figures). Vss connection region 438 has a substantially similar resistance to Vss connection region 238 in FIG. 2C. Also at step 356, mask 444 in FIG. 4C is removed in a similar manner as mask 424 in FIG. 4A. In one embodiment, mask 444 is removed and a new mask is formed over the approximate one half of stacked gate structure 408 situated adjacent to drain region 420 and over drain region 420 of substrate 404 prior to formation of Vss connection region 438. In such embodiment, the new mask is removed after formation of Vss connection region 438 in a similar manner as mask 444 in FIG. 4C. Referring to FIG. 4D, the result of step 456 of flowchart 300 is illustrated by structure 456.

In the embodiment of the present invention in FIG. 3, recess 428 is utilized to situate Vss connection region 438 below top surface 406 of substrate 404 by a distance equal to depth 436 of recess 428 and also to situate Vss connection region 438 below source 434. As a result, the embodiment of the present invention in FIG. 3 achieves a reduction in lateral diffusion of source 434 into channel region 422. Furthermore, the amount of reduction in lateral diffusion of source 434 into channel region 422 can be determined by appropriately selecting depth 436 of recess 428. By reducing lateral diffusion of source 434 into channel region 422, the embodiment of the present invention in FIG. 3 advantageously achieves a reduction in DIBL in floating gate memory cell 402.

Additionally, in the embodiment of the present invention in FIG. 3, by forming recess 428 to appropriately situate Vss connection region 438 below top surface 406 of substrate 404 and to situate Vss connection region 438 below source 434, the resistance of Vss connection region 438, i.e. Vss resistance, can be decreased by heavily doping Vss connection region 438 without causing an undesirably increase in DIBL.

Thus, in the embodiments of the present invention in FIGS. 1 and 3, by situating a Vss connection region at an appropriate depth below the top surface of the substrate and below the source, the present invention advantageously achieves a desirably low Vss resistance, which causes an increase in floating gate memory cell performance, and reduced DIBL in the floating gate memory cell, such as a NOR-type floating gate flash memory cell.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, structure and method for low Vss resistance and reduced DIBL in a floating gate memory cell have been described.

The invention claimed is:

1. A floating gate memory cell situated on a substrate, said floating gate memory cell comprising:
    a stacked gate structure situated on said substrate, said stacked gate structure being situated over a channel region in said substrate;
    a recess formed in said substrate adjacent to said stacked gate structure, said recess having a sidewall, a bottom, and a depth;
    a source of said floating gate memory cell situated adjacent to said sidewall of said recess and under said stacked gate structure;
    a Vss connection region situated under said bottom of said recess and under said source, said Vss connection region being connected to said source, said Vss connection region being a heavily doped region to reduce a Vss resistance;
    wherein said Vss connection region being situated under said bottom of said recess causes said source to have a reduced lateral diffusion in said channel region, thereby preventing an increase in a drain induced barrier lowering.

2. The floating gate memory cell of claim 1 wherein said reduced lateral diffusion of said source causes a reduction in drain induced barrier lowering in said floating gate memory cell.

3. The floating gate memory cell of claim 1 wherein said sidewall of said recess is substantially perpendicular to a top surface of said substrate.

4. The floating gate memory cell of claim 1 wherein said depth of said recess is between approximately 200.0 Angstroms and approximately 500.0 Angstroms.

5. The floating gate memory cell of claim 1 wherein said stacked gate structure comprises an ONO stack situated on a floating gate.

6. The floating gate memory cell of claim 1 wherein said floating gate memory cell is a NOR-type floating gate flash memory cell.

7. A floating gate memory cell situated on a substrate, said floating gate memory cell comprising a stacked gate structure situated on said substrate, said stacked gate structure being situated over a channel region in said substrate, a recess formed in said substrate adjacent to said stacked gate structure, said recess having a sidewall, a bottom, and a depth, said floating gate memory cell being characterized in that:
    a source of said floating gate memory cell is situated adjacent to said sidewall of said recess and under said stacked gate structure, a Vss connection region is situated under said bottom of said recess and under said source, said Vss connection region being connected to said source, said Vss connection region being a heavily doped region to reduce a Vss resistance, wherein said Vss connection region being situated under said bottom of said recess causes said source to have a reduced lateral diffusion in said channel region, thereby preventing an increase in a drain induced barrier lowering.

8. The floating gate memory cell of claim 7 wherein said reduced lateral diffusion of said source causes a reduction in drain induced barrier lowering in said floating gate memory cell.

9. The floating gate memory cell of claim 7 wherein said sidewall of said recess is substantially perpendicular to a top surface of said substrate.

10. The floating gate memory cell of claim 7 wherein said depth of said recess is between approximately 200.0 Angstroms and approximately 500.0 Angstroms.

11. The floating gate memory cell of claim 7 wherein said stacked gate structure comprises an ONO stack situated on a floating gate.

12. The floating gate memory cell of claim 7 wherein said floating gate memory cell is a NOR-type floating gate flash memory cell.

* * * * *